United States Patent [19]

Terasawa et al.

[11] 3,990,090
[45] Nov. 2, 1976

[54] SEMICONDUCTOR CONTROLLED RECTIFIER

[75] Inventors: Yoshio Terasawa; Shin Kimura, both of Hitachi, Japan

[73] Assignee: Hitachi, Ltd., Japan

[22] Filed: Apr. 12, 1974

[21] Appl. No.: 460,479

[30] Foreign Application Priority Data
Apr. 18, 1973  Japan.................................. 48-43134

[52] U.S. Cl..................................... 357/38; 357/68; 357/86
[51] Int. Cl.²........................................ H01L 29/74
[58] Field of Search ..................... 357/38, 86, 39, 68

[56] References Cited
UNITED STATES PATENTS

| | | | |
|---|---|---|---|
| 3,360,696 | 12/1967 | Neilson et al. .......................... | 357/38 |
| 3,428,874 | 2/1969 | Gerlach ................................... | 357/38 |
| 3,462,620 | 8/1969 | Weinstein ............................... | 357/38 |
| 3,526,815 | 9/1970 | Svedberg et al. ...................... | 357/38 |
| 3,543,105 | 11/1970 | Svedberg et al. ...................... | 357/38 |
| 3,566,211 | 2/1971 | Svedberg ................................ | 357/38 |
| 3,670,217 | 6/1972 | Boksjo et al. .......................... | 357/38 |
| 3,725,753 | 4/1973 | Garrett ................................... | 357/38 |
| 3,836,994 | 9/1974 | Piccone et al. ......................... | 357/86 |
| 3,914,783 | 10/1975 | Terasawa ............................... | 357/38 |
| 3,943,548 | 3/1976 | Terasawa ............................... | 357/38 |

*Primary Examiner*—Michael J. Lynch
*Assistant Examiner*—Joseph E. Clawson, Jr.
*Attorney, Agent, or Firm*—Craig & Antonelli

[57] ABSTRACT

A semiconductor controlled rectifier comprising a semiconductor substrate of four-layer structure consisting of alternate P and N layers; a pair of main electrodes kept in ohmic contact with the exposed surfaces of outermost P and N layers; a gate electrode kept in contact with the surface of an intermediate layer; and an auxiliary electrode disposed on the surface of the intermediate layer, which is separated from the gate electrode, lies opposite to the main electrode with respect to the gate electrode, and has a portion located near the main electrode.

6 Claims, 16 Drawing Figures

SEMICONDUCTOR CONTROLLED RECTIFIER

BACKGROUND OF THE INVENTION

1. FIELD OF THE INVENTION

The present invention relates to a semiconductor controlled rectifier, and more particularly to a semiconductor controlled rectifier provided with an auxiliary electrode near the gate electrode.

2. DESCRIPTION OF THE PRIOR ART

A semiconductor controlled rectifier, which is turned on in response to a gating signal applied to the gate electrode, comprises a semiconductor substrate having at least four layers of P and N conductivity types, disposed alternately; a pair of main electrodes kept in ohmic contact with the outer surfaces of two outermost layers; and a gate electrode connected with one of the four layers of the substrate. If a gating signal is applied to the gate electrode of such a semiconductor controlled rectifieer with a forward voltage applied between the main electrodes, the four-layer region between the main electrodes is driven from its cut-off (non-conductive) state into its conductive state. The change of state from cut-off to conduction is termed "turn-on". A semiconductor controlled rectifier may be turned on by a signal other than a gating signal. For example, the turn-on of a semiconductor controlled rectifier takes place when the forward applied voltage across the device exceeds the maximum allowable voltage or when the rate of increase of the forward voltage, i.e., dv/dt is too great. The phenomenon that the device is turned on by a forward voltage lower than the maximum allowable voltage, makes it impossible for a four- or five-layer, three-or four-terminal device to be controlled in its turn-on operation by a gating signal so that it can not be used in a circuit which is operated at high frequency or draws a heavy current. If a semiconductor controlled rectifier is turned on when the rate of increase of the forward voltage, i.e. dv/dt, is rather small, then the semiconductor device is said, in this specification, to have a small dv/dt capability. If the dv/dt capability is small, it is necessary to reduce the rate of increase of the forward voltage applied between the main electrodes by connecting a capacitor between the main electrodes so as not to turn on the device before a gate signal is applied. In this case, the smaller is the dv/dt, the greater capacitance the capacitor must have. Consequently, the overall size of the device is larger than reasonable. Therefore, it is necessary to make the dv/dt capability as high as possible.

FIG. 1 shows a well-known four-layer three-terminal SCR (semiconductor controlled rectifier), i.e. thyristor, which has a large dv/dt capability. In FIG. 1, a semiconductor substrate 1 of four-layer structure has layers $P_E$, $N_B$, $P_B$ and $N_E$. The layer $N_B$ has N-type conductivity and forms a base. The layers $P_E$ and $P_B$ have P-type conductivity, serve as an emitter and a base and form a first and a second PN junctions $J_1$ and $J_2$ with the layer $N_B$. The layer $N_E$ has N-type conductivity and formed in the P-base layer $P_B$ to form a third PN junction with the layer $P_B$. An anode electrode 2 and a cathode electrode 3 are disposed on the P-emitter layer $P_E$ and the N-emitter layer $N_E$ in ohmic contact therewith. A gate electrode 4 is connected with the surface of the P-base layer $P_B$ and a resistor 5 is connected between the cathode 3 and the gate 4.

Now, if a voltage with its positive polarity at the anode 2, i.e. a forward voltage, is applied between the anode 2 and the cathode 3 of a thyristor having such a structure as described above, the second PN junction $J_2$ is inversely biased. Accordingly, the width of a depletion layer formed on both the sides of the PN junction $J_2$ increases so that displacement current flows. The displacement current increases in proportion to the rate of increase of the forward applied voltage. Moreover, the increase of the forward applied voltage is accompanied by the increase in the leakage current through the second PN junction $J_2$. The third PN junction $J_3$ is forward biassed due to the displacement current and the leakage current so that carriers are injected from the N-emitter layer $N_E$ into the P-base layer $P_B$. The degree of the third PN junction $J_3$ being forward-biased is greater at the peripheral portion of the N-emitter layer $N_E$ where the displacement current and the leakage current from the second PN junction $J_2$ which are not in registration with the N-emitter layer $N_E$ concentrate, than at the central portion of the layer $N_E$. Accordingly, if the rate of increase in the forward applied voltage is high enough, the thyristor is erroneously turned on due to the local turn-on phenomenon taking place at the peripheral portion of the N-emitter layer $N_E$. The resistor 5 connected between the cathode 3 and the gate electrode 4, as shown in FIG. 1, enables the displacement and the leakage currents near the gate electrode 4 to flow through the gate electrode 4 and the resistor 5 into the cathode 3 so that the degree of the third PN junction $J_3$ being forward biased decreases to suppress the erroneous turn-on action to a certain extent. In this case, the smaller is the value of the resistor 5, the greater are the displacement current and the leakage current flowing through the resistor 5 into the cathode 3, so that the effect of suppressing the erroneous turn-on increases. However, if the value of the resistor 5 decreases, the current of the gating signal is by-passed through the resistor 5 to decrease the effective gating current. Therefore, a large-current gating signal is needed to effectively turn the thyristor on. This is one of the drawbacks of a conventional thyristor.

The leakage current of an SCR at its forward OFF-state is determined depending upon the temperature of the SCR. Accordingly, if the temperature of the device rises and the device is kept at high temperatures, the leakage current increases to turn on the device before a gating signal is applied. Thus, temperature has the same effect as in case where the dv/dt is high. Consequently, the attempts to avoid the effect is necessarily accompanied by the same drawback as is incurred in case of improving the dv/dt capability.

SUMMARY OF THE INVENTION

One object of the present invention is to provide a semiconductor controlled rectifier having a novel structure.

Another object of the present invention is to provide a novel semiconductor controlled rectifier having a high dv/dt capability.

An additional object of the present invention is to provide a novel semiconductor controlled rectifier which is almost free from erroneous turn-on operation due to temperature rise.

Yet another object of the present invention is to provide a novel semiconductor controlled rectifier which has a large dv/dt capability with rather a small gating current and which is hardly affected by temperature rise.

A further object of the present invention is to provide a novel semiconductor controlled rectifier which is adapted for use in a circuit operated with a high voltage or at high frequencies.

Yet an additional object of the present invention is to provide a novel semiconductor controlled rectifier having a high reliability.

Other objects of the present invention will be apparent from the following description of the embodiments.

DESCRIPTION OF THE PREFERRED EMBODIMENTS

According to the feature of the present invention, there is provided a semiconductor controlled rectifier, i.e. an SCR for short, in which the displacement current and the leakage current are by-passed through an outer portion of a surface where a gate electrode is provided, and more particularly an SCR in which an auxiliary electrode is provided in addition to a gate electrode on the surface of an intermediate layer of a multi-layer semiconductor substrate, and the displacement current and the leakage current are by-passed through the auxiliary electrode.

The present invention will now be described by way of the embodiments, with the aid of the attached drawings.

Figure 1:
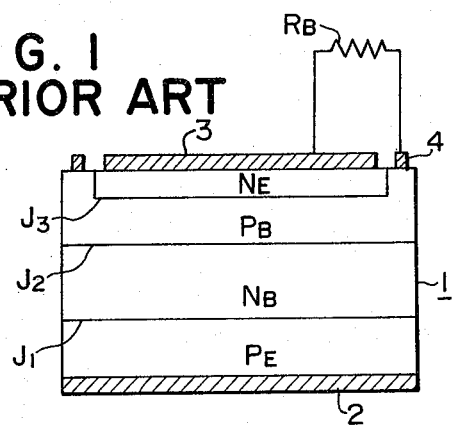
FIG. 1 shows in longitudinal cross section of a conventional semiconductor controlled rectifier.
Figure 2:
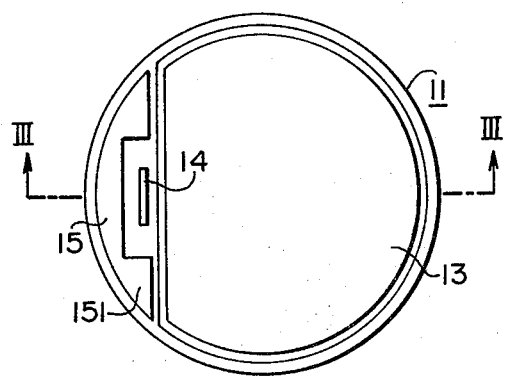
FIG. 2 shows in a plan view a semiconductor controlled rectifier as a first embodiment of the present invention.
Figure 3:
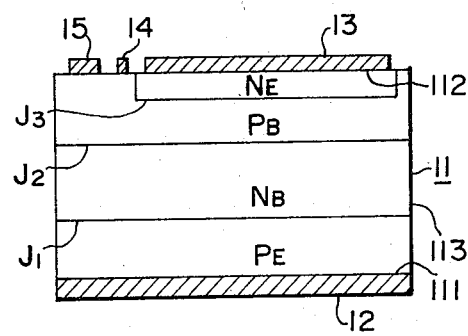
FIG. 3 is a cross section taken along line III—III in FIG. 2.

In FIGS. 2 and 3 in which a first embodiment of the present invention is shown, a semiconductor substrate 11 has, between its principal surfaces 111 and 112, four layers $P_E$, $N_B$, $P_B$ and $N_E$ having different conductivity types. The layer $P_E$ is of P-type conductivity and serves as an emitter layer (hereafter referred to as a $P_E$ layer); the layer $N_B$ is of N-type conductivity and disposed on the $P_E$ layer to serve as a base layer and to form a PN junction $J_1$ therebetween (hereafter referred to as an $N_B$ layer); the layer $P_B$ is of P-type conductivity and disposed on the $N_B$ layer to serve as a base layer and to form a PN junction $J_2$ therebetween (hereafter referred to as a $P_B$ layer); and the layer $N_E$ is of N-type conductivity and formed in the $P_B$ layer to serve as an emitter layer and to form a PN junction $J_3$ therebetween (hereafter referred to as an $N_E$ layer). A pair of main electrodes 12 and 13 is disposed respectively on the principal surfaces 111 and 112 and kept in ohmic contact with the $P_E$ layer and the $N_E$ layer. A gate electrode 14 is provided on the $P_B$ layer in the principal surface 112. An auxiliary electrode 15 is so disposed on the $P_B$ layer in the principal surface 112 as to surround the gate electrode 14 on the side opposite to the main electrode 13. The auxiliary electrode 15 has a portion 151 located near the main electrode 13. The gate electrode 14 is so located on the $P_B$ layer that if a gate voltage is applied between the gate electrode 14 and the main electrode 13 with the gate electrode 14 maintained at positive potential, most part of the gate current flows from the gate electrode 14 to the $N_E$ layer opposite thereto to initially turn on the part of the $N_E$ layer opposite to the gate electrode 14. Namely, the circuit design is such that the impedance of the path from the gate electrode 14 to the $N_E$ layer is smaller than the impedance of the path from the gate electrode 14, through the auxiliary electrode 15, to the $N_E$ layer. As seen in the figure, the gate electrode 14 is formed nearer to the $N_E$ layer than the auxiliary electrode 15. In the formation of the actual semiconductor device, the exposed portion of the PN junctions is coated with a passivation layer, or the side surface 113 is inclined with respect to the PN junctions to form a bevel structure and the semiconductor substrate 11 is housed in a hermetical casing. However, such structures as necessary for an actual device ready for practical application are not the gist of the invention and they are omitted in the figures.

With this structure shown in FIGS. 2 and 3 and described above, the displacement current and the leakage current through that portion of the PN junction $J_2$ except the portion lying just below the $N_E$ layer (that is, which does not correspond to the projection of the $N_E$ layer upon the surface of the PN junction $J_2$) are prevented from concentrating on the periphery of the PN junction $J_3$ opposite to the gate electrode 14 and led through the auxiliary electrode 15 to the main electrode 13. Since the displacement current and the leakage current from the auxiliary electrode 15 to the main electrode 13 flow through the low resistive parts in the surfaces of the $P_B$ and $N_E$ layers, the danger that the device is turned on due to the forward biassing of the PN junction $J_3$ by those currents flowing through the portion of the PN junction $J_3$ parallel to the principal surface 112 is eliminated to a considerable extent notwithstanding the existence of the PN junction $J_3$. Thus, the dv/dt capability and the forward blocking voltage can be increased. Moreover, with this structure as mentioned above, most of the gate current flows directly into the $N_E$ layer, irrespective of the auxiliary electrode 15, and serves to turn on the device, so that the gate current necessary to turn on the device need not be increased so much. As shown in FIG. 3, a part of the PN junction $J_3$ is between the auxiliary electrode 15 and the main electrode 13. With this structure, however, there is still left a problem that if the amount of the displacement and the leakage currents is considerable, the device may be erroneously turned on by the currents. This problem can be easily solved if the structure shown in FIGS. 2 and 3 is slightly changed. Namely, the solutions are (1) the provision of a resistor (impedance) connecting the auxiliary electrode 15 with the main electrode 13, (2) the extension of one of the main and auxiliary electrodes beyond the PN junction $J_3$ toward the other, and (3) the connection of the auxiliary electrode 15 with the main electrode 13 at the place remote from the gate electrode 14. According to the present invention, the auxiliary electrode 15 and the main electrode 13 are made proximate to each other in the way shown in the figures and in three ways described above and these ways are termed, in this specification, electric proximity means.

Figure 4:
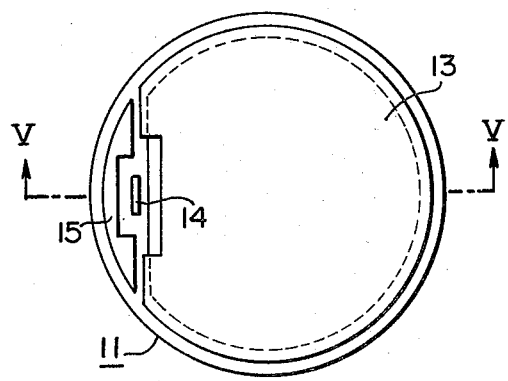
FIG. 4 shows in a plan view a semiconductor controlled rectifier as a second embodiment of the present invention.
Figure 5:
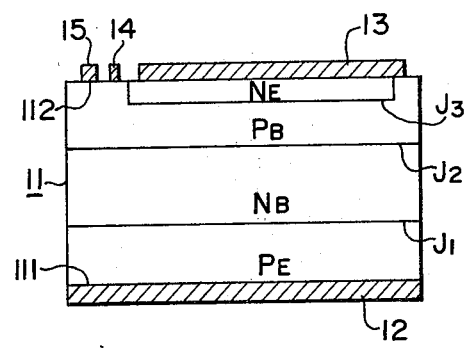
FIG. 5 is a cross section taken along line V—V in FIG. 4.

FIGS. 4 and 5 show an SCR as a second embodiment of the present invention, in which the portion of the main electrode 13 except the portion opposite to the gate electrode 14 is extended beyond the PN junction $J_3$ toward the $P_B$ layer. This structure has the following merits, as compared with that of the first embodiment: (1) the auxiliary electrode 15 and the main electrode 13 are opposed to each other on the $P_B$ layer so that even if the displacement current and the leakage current increase, the most part of the currents flows from the $P_B$ layer directly to the main electrode 13 with the result that the device is prevented from being erroneously turned on, and (2) the main electrode 13 is in contact with the $P_B$ layer on nearly the entire area of the principal surface 112 of the semiconductor substrate 11 so that the erroneous turn-on at other portions of the $N_E$ layer than that opposite to the gate electrode 14 can be prevented.

Figure 6:
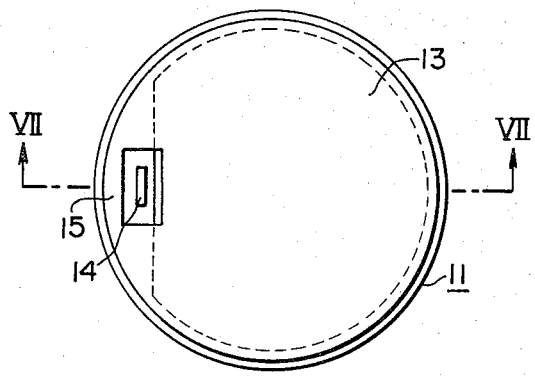
FIG. 6 shows in a plan view a semiconductor controlled rectifier as a third embodiment of the present invention.
Figure 7:
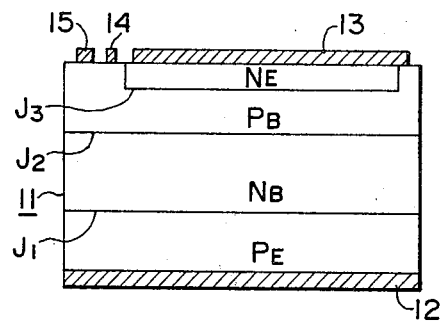
FIG. 7 is a cross section taken along line VII—VII in FIG. 6.

FIGS. 6 and 7 show an SCR as a third embodiment of the present invention, in which the auxiliary electrode 15 is connected with the main electrode 13 at the place remote from the gate electrode 14. With this structure, the electric resistance between the auxiliary electrode 15 and the main electrode 13 is smaller than in the second embodiment so that the dv/dt capability is further improved. However, there is left a problem that since the amount of the component of the gate current diverted through the auxiliary electrode 15 to the main electrode 13 increases, the gate current necessary to turn on the device must be appreciably increased. This problem can be solved by the fourth embodiment of the invention described below.

Figure 8:
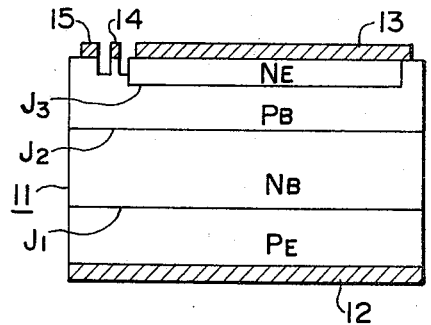
FIG. 8 shows in a plan view a semiconductor controlled rectifier as a fourth embodiment of the present invention.

FIG. 8 shows an SCR as a fourth embodiment of the present invention, in which the portion of the $P_B$ layer around the gate electrode 14 is made thin through etching or other suitable methods. With this structure, there are obtained the following merits. Namely, the by-passing of the gate current to the auxiliary electrode, which cannot be prevented with the structure of the third embodiment, can be prevented and the distances between the main electrode 13 and the gate electrode 14 and between the gate electrode 14 and the auxiliary electrode 15 can be made smaller.

Figure 9:
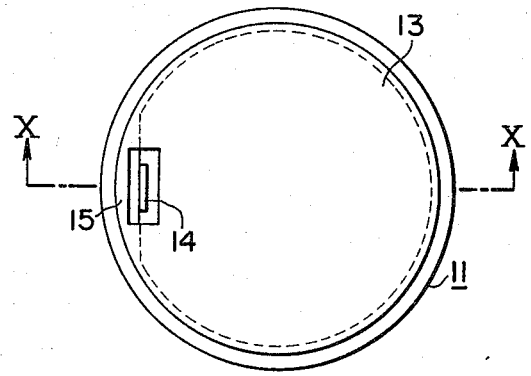
FIG. 9 shows in a plan view a semiconductor controlled rectifier as a fifth embodiment of the present invention.
Figure 10:
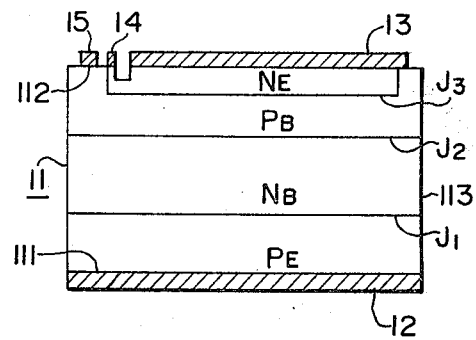
FIG. 10 is a cross section taken along lines X—X in FIG. 9.

FIGS. 9 and 10 shown an SCR as a fifth embodiment of the present invention, in which the auxiliary electrode 15 and the main electrode 13 are integrally formed, with the gate electrode 14 provided on the edge of the $N_E$ layer. The auxiliary electrode 15 and the main electrode 13 are located opposite to each other with respect to the gate electrode 14. It is preferable to reduce the thickness of the $N_E$ layer between the gate electrode 14 and the main electrode 13. This structure can enjoy the same effect as the structures of the foregoing embodiments. The integral formation of the auxiliary electrode 15 and the main electrode 13 may be replaced by other electric proximity means.

Figure 11:
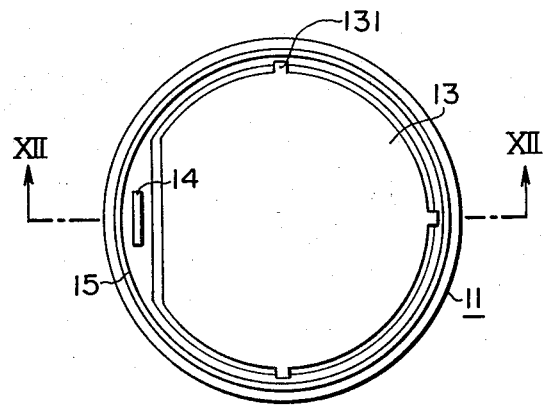
FIG. 11 shows in a plan view a semiconductor controlled rectifier as a sixth embodiment of the present invention.
Figure 12:
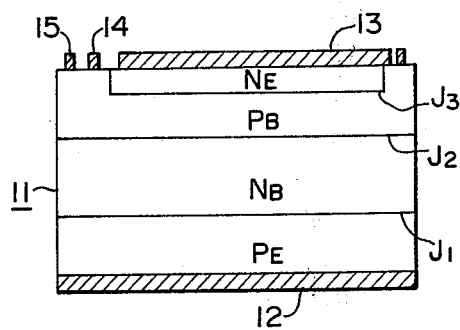
FIG. 12 is a cross section taken along line XII—XII in FIG. 11.

FIGS. 11 and 12 show an SCR as a sixth embodiment of the present invention, in which the auxiliary electrode 15 is so provided on the $P_B$ layer as to encircle the main electrode 13 and the gate electrode 14 and the portions 131 of the main electrode 13 are extended beyond the PN junction $J_3$ toward the auxiliary electrode 15 at the places remote from the gate electrode 14. In this structure, the dv/dt capability and the forward blocking voltage are lower than in the structure of the third embodiment shown in FIGS. 6 and 7, but there is an advantage that since the by-pass of the gate current decreases, the gate current necessary to turn on the device can be made smaller.

Figure 13:
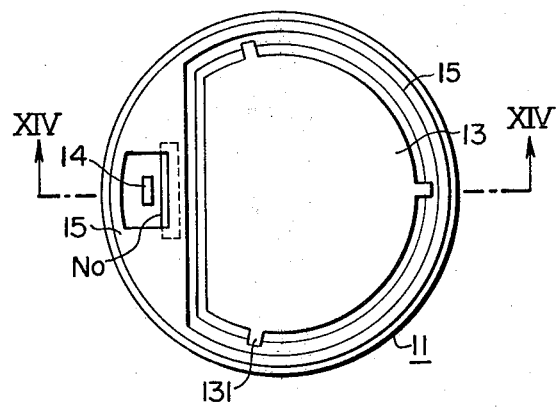
FIG. 13 shows in a plan view a semiconductor controlled rectifier as a seventh embodiment of the present invention.
Figure 14:
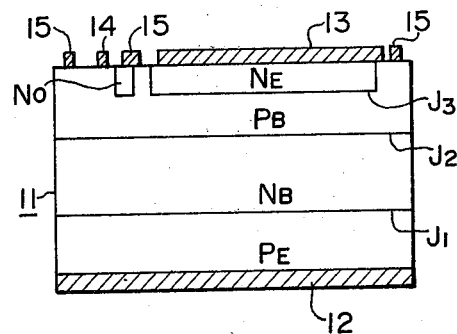
FIG. 14 is a cross section taken along line XIV—XIV in FIG. 13.

FIGS. 13 and 14 show an SCR as a seventh embodiment of the present invention, in which the amplifying gate configuration is employed. In this structure, a small region $N_o$ of N-type conductivity is formed in the $P_B$ layer between the gate electrode 14 and the $N_E$ layer, the auxiliary electrode 15 is provided on both the surfaces of the $P_B$ layer and the small region $N_o$ except the portion of the $P_B$ layer surface around the gate electrode 14 and the portion of the surface of the small region $N_o$ near the gate electrode 14, and the portions 131 of the main electrode 13 are extended beyond the PN junction $J_3$ toward the auxiliary electrode 15 at the places remote from the gate electrode 14. This structure has an advantage that the initial turn-on over a large area of the $N_E$ layer can be caused with a small gate current through the gate electrode 14, as well as the effects obtained by the previous embodiments, and the structure is most suitable for a high power SCR. In FIGS. 13 and 14, the auxiliary electrode 15 is shown as encircling the $N_E$ layer, but it need not necessarily encircle the $N_E$ layer. The shape of the auxiliary electrode 15 should be determined depending upon the area of the initial turn-on region and the required dv/dt capability. The size of each portion 131 and the number of the portions 131 should also be determined for the same reason. Further, in this case, the same result can be obtained even if the portion of the auxiliary electrode 15 between the main electrode 13 and the gate electrode 14 is removed.

Figure 15:
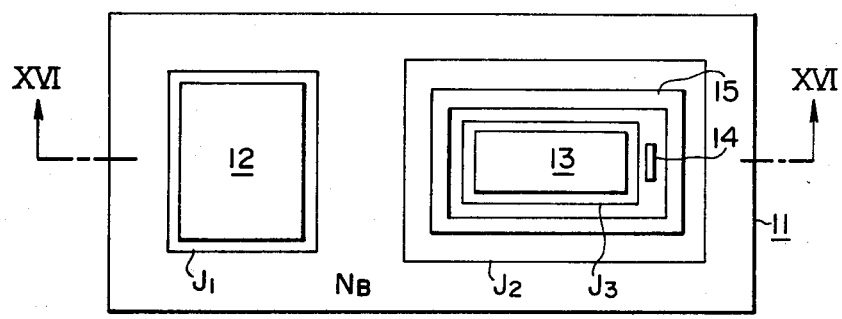
FIG. 15 shows in a plan view a semiconductor controlled rectifier as a eighth embodiment of the present invention.
Figure 16:
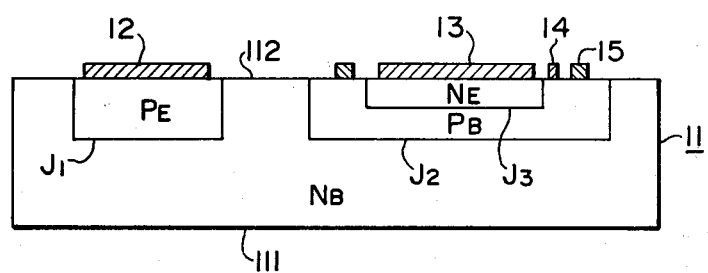
FIG. 16 is a cross section taken along line XVI—XVI in FIG. 15.

FIGS. 15 and 16 show an SCR as an eighth embodiment of the present invention, in which the present invention is applied to a device in which PN junctions are exposed in one of the principal surfaces of the semiconductor substrate (i.e. a device of lateral type). The difference of this embodiment from the previous ones is that all the PN junctions $J_1$, $J_2$ and $J_3$ are exposed in the principal surface 112 while a pair of main electrodes 12 and 13 are in ohmic contact with the $P_E$ and $N_E$ layers on the principal surface 112. The gate electrode 14 and the auxiliary electrode 15 have structures analogous to those in the previous embodiments and therefore can enjoy the same effects.

As apparent from the description of the above embodiments, the present invention can be applied to any SCR that has a PNPN structure and is turned on by a gating signal received at the gate electrode, irrespective of the disposition of the PN junctions (as in the bevel, mesa, planar and lateral types) and the structure of the gate (as in the spot gate, stripe gate, field effect gate, amplifying gate, P-gate and N-gate types). Moreover, the present invention can be applied to each SCR element of a semiconductor device consisting of two PNPN SCR's formed integrally in the inverse parallel configuration or of a PNPN SCR and a PN junction rectifier formed integrally in the inverse parallel configuration.

In conclusion, the effect of the present invention will be numerically described. An SCR having the same structure as the embodiment shown in FIGS. 13 and 14, a rated blocking voltage of 1200 V and a rated current of 400 A, is taken for example. A well-known device of amplifying gate type which is devoid of the auxiliary electrode 15 and the portions 131 of the main electrode 13 and has a forward blocking voltage of 1200 V, is turned at a forward applied voltage increase rate dv/dt of 600 V/$\mu$s. On the other hand, an improved device with the auxiliary electrode 15 and the portions 131 has a dv/dt capability of 1200 V/$\mu$s and a forward blocking voltage of 3000 V, which are more than twice compared with those of the conventional device. Moreover, the dv/dt capability of the conventional device at 20° C is 600 V/$\mu$s, but the device according to the present invention is not turned on at a forward applied voltage increase rate dv/dt of 600 V/$\mu$s even at 120° C. Thus, the temperature characteristic is much improved according to the present invention. These results have been obtained with the same gate circuit.

What we claim is:

1. A semiconductor controlled rectifier comprising:
   a semiconductor substrate having a pair of opposite principal surfaces and having, between said principal surfaces, a first layer of one conductivity type, a second layer of the other conductivity type disposed adjacent to said first layer to form a first PN junction therebetween, a third layer of said one conductivity type disposed adjacent to said second layer to form a second PN junction therebetween, and a fourth layer of said other conductivity type disposed adjacent to said third layer to form a third PN junction therebetween, the exposed surfaces of said first and second layers forming one of said principal surfaces and the exposed surface of at least said fourth layer forming the other principal surface;
   a first main electrode in contact with at least said first layer in said one principal surface of said semiconductor substrate;
   a second main electrode in contact with at least said fourth layer in said other principal surface of said semiconductor substrate;
   a gate electrode provided on the surface of said second layer in said one principal surface of said semiconductor substrate and separated from said first main electrode;
   a small region of said one conductivity type formed in said second layer with its surface exposed, separated from said first main electrode, said gate electrode and said first layer, and located between said first main electrode and said gate electrode;
   a conductor layer to connect said small region with said second layer on said one principal surface of said semiconductor substrate; and
   an auxiliary electrode provided on the surface of said second layer in said one principal surface of said semiconductor substrate and having a first portion separated from said gate electrode, said gate electrode being disposed between said first main electrode and said auxiliary electrode, and a second portion disposed adjacent but spaced apart from said first main electrode at a place remote from the place where said first main electrode and said conductor layer face each other; and
   wherein the spacing between the second portion of said auxiliary electrode and said first main electrodes is reduced at proscribed portions thereof, decreasing the impedance between said auxiliary electrode and said first main electrode to thereby by-pass displacement current and leakage current in the substrate adjacent the gate electrode by way of said auxiliary electrode to said first main electrode; and
   wherein said first main electrode is extended beyond said first PN junction onto said second layer at least at a portion of the area where said first main electrode and said second portion of said auxiliary electrode face each other.

2. A semiconductor controlled rectifier as claimed in claim 1, wherein said second portion of said auxiliary electrode is extended along the edge of said first layer.

3. A semiconductor controlled rectifier as claimed in claim 1, wherein said second portion of said auxiliary electrode is connected with said conductor layer.

4. A semiconductor controlled rectifier comprising:
   a semiconductor substrate having first and second principal surfaces and including
   a first semiconductor layer of a first conductivity type exposed at said first principal surface,
   a second semiconductor layer of a second conductivity type, opposite said first conductivity type, contacting said first semiconductor layer and defining therewith a first PN junction;
   a third semiconductor layer of said first conductivity type contacting said second semiconductor layer and defining therewith a second PN junction, said third semiconductor layer extending to said second principal surface;
   a fourth semiconductor layer of said second conductivity type contacting said third semiconductor layer and defining therewith a third PN junction, said fourth semiconductor layer and said third PN junction extending to said second principal surface, and
   a fifth semiconductor layer of said second conductivity type contacting said third semiconductor layer and defining therewith a fourth PN junction, said fifth semiconductor layer and said fourth PN junction extending to said second principal surface and being spaced apart from said fourth semiconductor layer and the termination of said third PN junction at said second principal surface by the semiconductor material of said third semiconductor layer therebetween;
   a first main electrode disposed on said first principal surface of said substrate so as to contact said first semiconductor layer;
   a second main electrode disposed on said second principal surface of said substrate so as to contact said fourth semiconductor layer and to partially overlap the termination of said third PN junction at said second principal surface at at least one location along said third PN junction other than where the semiconductor material of said third semiconductor layer is interposed between said fourth and fifth semiconductor layers;

a gate electrode disposed on said second surface of said substrate, contacting said third semiconductor layer, and adjacent to but spaced apart from said fifth semiconductor layer so that said fifth semiconductor layer is disposed between said gate electrode and said fourth semiconductor layer; and an auxiliary electrode disposed on said second principal surface of said substrate so as to surround and be spaced apart from said gate electrode and said second main electrode.

5. A semiconductor controlled rectifier according to claim 4, wherein said auxiliary electrode further extends between said gate electrode and said second main electrode so as to overlap the termination of said fourth PN junction at said second principal surface while remaining spaced apart from each of said gate and second main electrodes.

6. A semiconductor controlled rectifier according to claim 5, wherein said auxiliary electrode overlaps the termination of said fourth PN junction at said second principal surface so as to leave a portion of said fifth semiconductor layer facing said gate electrode exposed at said second principal surface.

* * * * *